METHOD OF MANUFACTURING SEMICONDUCTOR DEVICES

Filed Oct. 17, 1966 Sheet 1 of 2

United States Patent Office 3,436,282
Patented Apr. 1, 1969

3,436,282

METHOD OF MANUFACTURING SEMICONDUCTOR DEVICES

Koichiro Shoda, Suita-shi, Japan, assignor to Matsushita Electronics Corporation, Osaka, Japan, a corporation of Japan Filed Oct. 17, 1966, Ser. No. 587,129
Claims priority, application Japan, Dec. 10, 1965, 40/76,832
Int. Cl. H01l 19/00, 7/44
U.S. Cl. 148—187 1 Claim

ABSTRACT OF THE DISCLOSURE

A method of manufacturing semiconductor devices by (1) providing on the surface of a semiconductor substrate a mask in which a plurality of openings are formed such that the widths of the portions of the mask between the openings are less than twice a predetermined depth of diffusion and (2) diffusing an impurity through the openings into the substrate to the predetermined depth to form diffused regions contiguous to each other.

The present invention relates to a method of manufacturing semiconductor devices, and more particularly to a novel method of diffusing an impurity into a semiconductor substrate.

In the manufacture of a semiconductor device, in order to form its active portion, it is essential to have a process which partially form p-type or n-type semiconductor regions by doping the semiconductor with a suitable impurity. There are various methods of performing the doping, but, of these methods, the diffusing method is most commonly employed due to its good controllability and wide adaptability.

An object of the present invention is to provide a method of manufacturing semiconductor devices of a quality, which have not been obtained so far by forming a diffused region which is quite different from that obtained by the conventional diffusion methods.

According to the present invention a novel method is provided for diffusing an impurity into a semiconductor. The present invention is characterized in that a masking film is provided for diffusion on the portion of a substrate into which an impurity is diffused, which film has openings formed therein with plane dimensions of less than twice the predetermined depth of diffusion.

Another object of the present invention is to locally form a diffused region, the quality of which is different from that of other portions, in a simultaneous diffusion process.

There are various diffusion methods, which include the vapor phase process, which diffuses an impurity into a semiconductor by contacting the impurity vapor to the semiconductor; the painting, solid phase and liquid phase methods which diffuse an impurity into a semiconductor by respectively contacting a powder form, solid form, and melted form impurity to the semiconductor. This invention may be applied to all of these processes.

Other objects and advantages of the present invention will become apparent from the following detailed description when taken in conjunction with the accompanying drawings, in which:

FIGS. 1 and 2 are schematical diagrams showing a comparison between a diffusing method of the invention and that of a conventional method, wherein FIG. 1 is a plan view and FIG. 2 is a side sectional view;

A comparison between the inventive diffusing method and a conventional one will be made with reference to FIGS. 1 and 2, wherein the portion marked A represents a diffused region obtained by a conventional method and the portion marked B represents the diffused region obtained according to the method of the invention.

Figure 1:
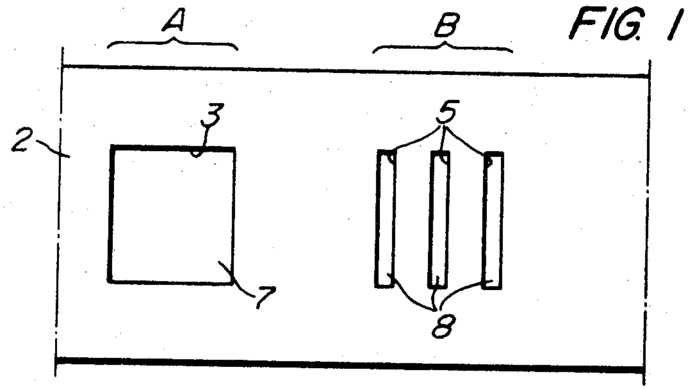
Figure 2:
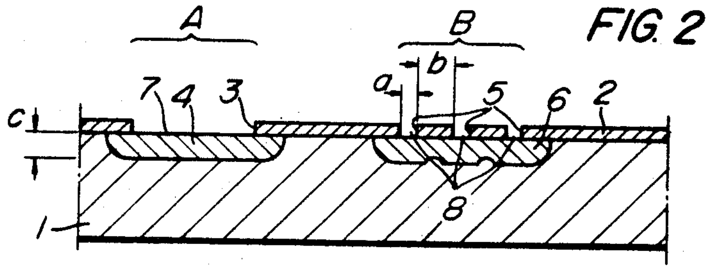

In FIGS. 1 and 2, the numeral 1 is an n-type silicon wafer, and the numeral 2 is an oxide film which acts as a mask for the impurity diffusion formed on its surface. In the conventional diffusing method, an opening 3 is provided in the oxide film 2, through which an impurity is diffused to form, for example, a p-type diffused region 4.

According to the invention, the openings for diffusing the impurity are provided by removing the oxide film in the same way as hitherto employed, but elongated openings 5 which have the width $a$ are provided in an arrangement of stripes with the intervals $b$ between them. The interval $b$ or width of remaining film between the openings should be less than twice the predetermined depth C of the p-type diffused region 6 which is obtained by the subsequent diffusion process—namely:

$$b<2C$$

Figure 3:
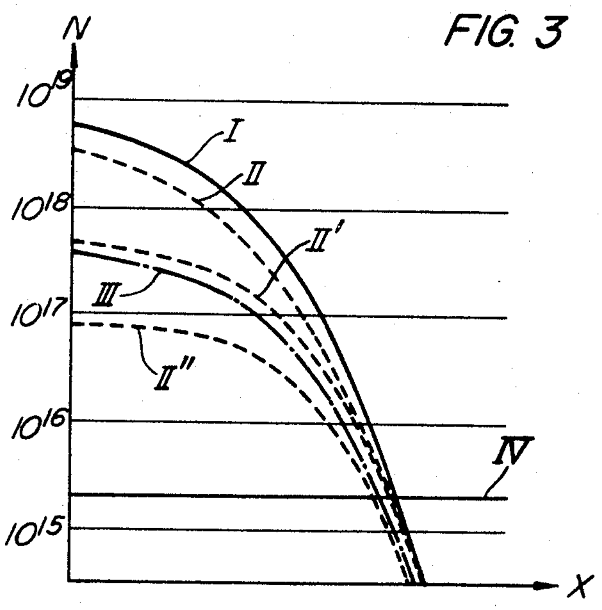
FIG. 3 is a diagram showing the distribution of concentration of diffused impurities.

The front surface of the impurity diffusion will proceed forming an envelope of innumerable spheres with their centers lying on the silicon surface portions 7 and 8 which are respectively exposed at the openings 3 and 5 provided in the oxide film 2, and, therefore, the p-type diffused region 6 obtained by this invention will have the diffused depth of the same degree as that of the diffused region 4 obtained by the conventional diffusing process. The concentration distribution of the diffused impurity, however, differs in these processes, the difference being as shown in FIG. 3. In FIG. 3, the abscissa represents the distance $x$ from the silicon surface to the interior, while the ordinate indicates the concentration N of the diffused impurity in the logarithmic scale. The curved line I represents the conventionally diffused impurity distribution, and the curved lines II, II′ and II″ represent the diffused impurity distributions obtained, measured randomly at several places, by the diffusing process of the invention. The distance $x$ at the point where these curved lines cross the straight line IV indicates the bulk impurity concentration of the n-type silicon wafer and corresponds to the diffusion depth C. The distribution curves obtained by the diffusion method of this invention differ in accordance with location as represented by the curves II, II′ and II″, but, if the width $a$ of the openings 5 and the interval $b$ therebetween shown in FIGS. 1 and 2 are made sufficiently smaller than the diffused depth C, the curves II, II′ and II″ will gradually converge to a certain curve, for example, to the curve III, and the difference in the distribution of the impurity concentration will be substantially eliminated. Also, it is clear that the value of $N$ at $x=0$ of this curve, in other words, the surface concentration, will be determined by the ratio of $a/(a+b)$. In short, according to the process of this invention, as shown in the B portion of FIGS. 1 and 2, by forming the openings 5 in the oxide film with the interval $b$, and by applying the same diffusion treatment, it is possible to obtain, with exceptionally good controllability, the diffused region which differs from A portion obtained in accordance with the conventional process. In FIGS. 1 and 2, the openings 5 in the oxide film 2 are all of equal dimensions and they are formed with equal intervals, but it is not always necessary to make them in that way. They may be made in a different way, for example, the width *a* of the openings may be made gradually reduced. Also, in the example mentioned above, the openings are formed in a striped shape, but they may be formed in a grid shape or in an array of rows and columns of innumerable squares. In the following examples, some embodiments of this invention will be described.

EXAMPLE 1

Figure 4:
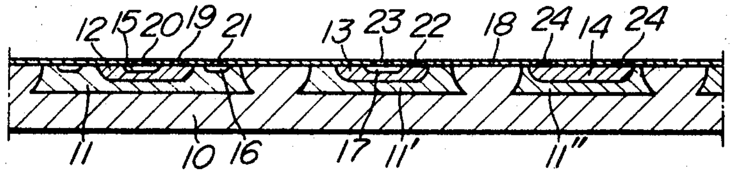
FIGS. 4 and 5 are sectional views of embodiments of the invention in the manufacture of a silicon integrated circuit.

In the manufacture of a silicon integrated circuit, the component elements are simultaneously made by a certain pattern of diffusing processes. FIG. 4 is an example thereof. Isolation diffused region 10 is formed by diffusing a p-type impurity in an n-type wafer, and the respective elements, i.e. a transistor, a diode, and a resistor are formed in islands II, II′, and II″, obtained thereby. In the first place, a base region 12, an anode region 13 and a resistance region 14 are formed by diffusing the p-type impurity. Then, an emitter region 15, a collector contact region 16 and a cathode region 17 are formed by diffusing an n-type impurity. Finally, after forming appropriate openings in an oxide film 18, a base electrode 19, an emitter electrode 20, a collector electrode 21, an anode electrode 22, a cathode electrode 23, and terminal electrodes 24 are provided by the vacuum evaporization of the electrode metal. In this way, the elements such as the transistor, the Zener diode, and the resistor are formed in the n-type islands II, II′, and II″. The design parameter of these elements is determined in accordance with that element which requires the strictest control in manufacture, namely, a transistor in this particular case. Accordingly, the Zener voltage of the Zener diode is equal to the reverse breakdown voltage between the emitter and the base of the transistor, and the resistance of the resistor is determined by the sheet resistivity $R_s$ of the base region 12. In the Zener diode, if the anode region 13 alone is formed by the diffusion of the p-type impurity according to the invention, it is possible to obtain a Zener diode by the simultaneous treatment which has a breakdown voltage differing from, namely, a desired breakdown voltage higher than the breakdown voltage between the emitter and the base of the transistor. Also, in the resistor element, if the resistance region 14 alone is formed by the diffusion of the p-type impurity in accordance with this invention, it is possible to obtain a region which has a sheet resistivity which differs from the resistivity $R_s$ in the base region of the transistor, namely a desired higher sheet resistivity. Accordingly, when manufacturing the resistor element with a high resistance, even if the width of the diffused layer is equal, the length thereof can be made short. Accordingly it is possible to cut down the area of the silicon wafer required for manufacturing the element.

EXAMPLE 2

Figure 5:
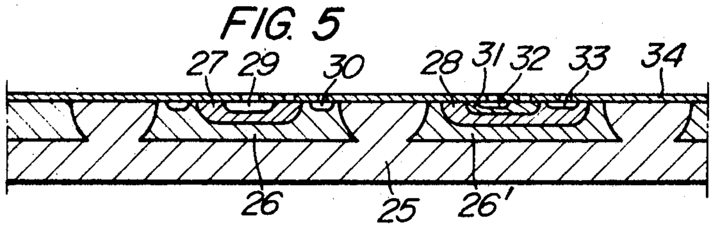

Similarly in the manufacture of a silicon integrated circuit, the embodiment of the case in which both npn-type and pnp-type transistors are to be manufactured is shown in FIG. 5. In the first place, a base region 27 and a collector region 28 of the npn-type transistor and the pnp-type transistor, respectively, are formed by diffusing a p-type impurity into isolated n-type islands 26 and 26′ in the isolation region 25, and, then, an emitter region 29, a collector contact region 30 and a base region 31 are formed by diffusing an n-type impurity, and, then, an emitter 32 and a collector contact region 33 of the pnp-type transistor are formed by diffusing a p-type impurity. Finally, an electrode for each element is provided by forming an appropriate opening in an oxide film 34.

Here, in order to obtain significant current amplification, the concentration of the n-type impurity in the emitter region 29 should be adequately higher than that of the p-type inpurity in the base region 27. If arranged in this way, namely, if the base region 31 is made of the same quality as the emitter region 29 mentioned above, the base region 31 of the pnp-type transistor may not be made adequately lower in the p-type impurity concentration than the emitter region 32, as the concentration of its impurity is too high and, for that reason, it is not possible to make the current amplification factor of this transistor higher. Now, when forming the base region 31 of this pnp-type transistor, if the diffusing process of this invention is applied to this particular portion alone, it will become possible to obtain a base region with a lower concentration of impurity and, accordingly, it will also become possible to manufacture the pnp-type transistor and the npn-type transistor with resonably high current amplification factors at the same time.

As mentioned above, the diffusing process of this invention has an advantage in that it gives considerably wide adaptability to the design of component elements in the manufacture of an integrated circuit.

EXAMPLE 3

Figure 6:
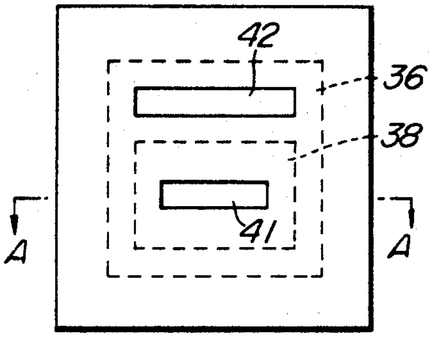
FIG. 6 is a plan view of an embodiment of the invention in the manufacture of a high frequency transistor.
Figure 7:
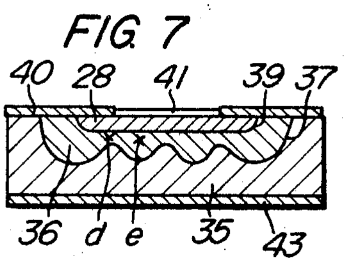
FIG. 7 is a sectional view along the line A—A of FIG. 6.

FIGS. 6 and 7 show a high frequency transistor manufactured by applying the diffusing process in accordance with this invention to the base diffusion. FIG. 6 is a plan view and FIG. 7 is a cross sectional view. A base region 36 is formed by diffusing a p-type impurity into an n-type silicon wafer 35, a wave-shaped collector junction 37 is made between the original wafer and the said base region 36, and, further, an emitter region 38 is formed by diffusing an n-type impurity, and an emitter junction 39 is made between the base region 36 and the said emitter region 38. Then, openings are formed in an oxide film 40 and an emitter electrode 41 and a base electrode 42 are provided on the front surface, while a collector electrode 43 is provided on the back surface. The distance between the emitter junction 39 and the collector junction 37 is called "base width," which has an important influence on the high frequency characteristic of the transistor. If the base region 36 is formed by the diffusing process of the invention, portions with a short base width (*d* portion) and portions with a long base width (*e* portion) will be produced. Minority carriers, which are to be injected into the base region 36 from the emitter junction 39 pass through the *d* portion with a narrow base width, and, as a result, it is possible to obtain the high frequency characteristic and high current amplification factor. On the other hand, a base current produced by the recombination of the minority carriers in the base region 36 flows to the base electrode 42 mainly through the *e* portion with low resistance, and, therefore, the transistor with low base resistance will be provided. In other words, in the conventional diffusion, the high cut-off frequency $f_{c\alpha}$ and the low base resistance $rbb'$ are opposing parameters; but, if the diffusing process in accordance with this invention is employed, a high frequency transistor with satisfactory values in both parameters can be obtained.

EXAMPLE 4

Figure 8:
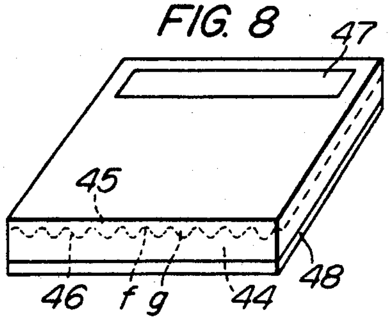
FIG. 8 is a perspective view of an embodiment of the invention in the manufacture of a solar cell.
Figure 9:
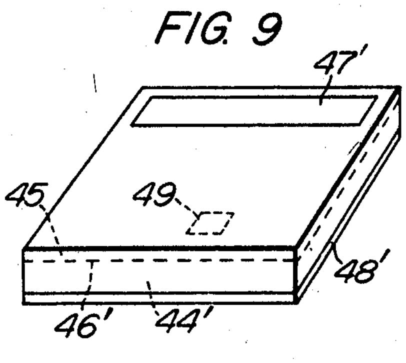
FIG. 9 is a perspective view of a conventional solar cell.

FIGS. 8 and 9 show solar cells. FIG. 9 shows one obtained by the conventional diffusing process and FIG. 8 indicates one obtained by the diffusing process of this invention. A p-type impurity is diffused into n-type silicon wafers 44 and 44′ to form p-type layers 45 and 45′ and then diffused junctions 46 and 46′ near the surface, and, in addition, positive electrodes 47 and 47′, and negative electrodes 48 and 48′ are provided, respectively, in the regions divided into two parts by the formation of the said junctions. In the cell in FIG. 9, using the conventional diffusing process, when a certain areal portion 49, for example, which is sufficiently remote from the positive electrode, is considered, one polarity of the electromotive force generated by the solar energy in that portion will appear at the negative electrode 48', and the other polarity thereof will appear at the positive electrode 47' through the p-type diffused layer 45'. At this time, the current which flows through the p-type diffused layer will become a loss which will result in the lowering of the efficiency of the cell. In order to decrease this loss, if the depth of the junction 46' is increased with a view to reducing the sheet resistance of this p-type diffused layer, the penetrating rate of sun light from the silicon surface to its junction will become less and the efficiency of the cell will be correspondingly reduced.

When the diffusing process of this invention is employed, the junction will have a wave-shape as shown in 46 in FIG. 8, and, as a result, the shallow portion *f* and the deep portion *g* will be formed according to the variation of the junction depth. If such a construction is adopted, the electromotive force will be mainly generated in the *f* portion, and the current generated thereby will flow to the positive electrode through the low resistive *g* portion, and, thus, it is possible to obtain a solar cell with satisfactory efficiency.

It is to be understood that the above-described embodiments are merely illustrative of the invention. Numerous other arrangements may be devised by those skilled in the art without departing from the spirit and scope of the invention as defined by the appended claim.

What is claimed is:

1. A method of manufacturing semiconductor devices comprising providing a film which acts as a mask for impurity diffusion and in which a plurality of openings are formed in such a manner that widths of remaining films between the openings are less than twice a predetermined depth of diffusion over the surface portion of a semiconductor substrate into which an impurity is to be diffused, and diffusing an impurity through said openings into said substrate to said predetermined depth to form diffused regions contiguous to each other.

References Cited

UNITED STATES PATENTS 2,981,877 4/1961 Noyce ------------ 148—187 X

L. DEWAYNE RUTLEDGE, *Primary Examiner.*

R. A. LESTER, *Assistant Examiner.*

U.S. Cl. X.R.

148—188, 189; 29—576, 578